United States Patent
Tamemoto et al.

(10) Patent No.: US 9,653,644 B2
(45) Date of Patent: May 16, 2017

(54) METHOD FOR MANUFACTURING SEMICONDUCTOR ELEMENT

(71) Applicant: NICHIA CORPORATION, Anan-shi, Tokushima (JP)

(72) Inventors: Hiroaki Tamemoto, Anan (JP); Ryota Taoka, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/279,811

(22) Filed: Sep. 29, 2016

(65) Prior Publication Data

US 2017/0098733 A1   Apr. 6, 2017

(30) Foreign Application Priority Data

Oct. 2, 2015  (JP) ................................. 2015-196595

(51) Int. Cl.

| | | |
|---|---|---|
| *H01L 21/786* | (2006.01) | |
| *B23K 26/50* | (2014.01) | |
| *B23K 26/53* | (2014.01) | |
| *H01L 33/00* | (2010.01) | |
| *H01L 33/06* | (2010.01) | |
| *H01L 33/32* | (2010.01) | |

(Continued)

(52) U.S. Cl.
CPC ...... *H01L 33/0095* (2013.01); *B23K 26/0054* (2013.01); *B23K 26/0057* (2013.01); *H01L 21/786* (2013.01); *H01L 33/06* (2013.01); *H01L 33/32* (2013.01); *H01L 33/42* (2013.01); *B23K 2201/40* (2013.01)

(58) Field of Classification Search
CPC ............ B23K 26/0054; B23K 26/0057; B23K 26/0063; B23K 2201/40; H01L 21/782; H01L 21/784; H01L 21/786; H01L 21/82; H01L 21/84; H01L 21/86; H01L 23/0095
USPC .................................................. 438/33, 463
See application file for complete search history.

(56) References Cited

U.S. PATENT DOCUMENTS 6,562,698 B2 * 5/2003 Manor ............... B23K 26/0604
257/E21.599
9,583,674 B2 * 2/2017 Minakuchi .......... H01L 33/0095
(Continued)

FOREIGN PATENT DOCUMENTS

| JP | 2002-205180 A | 7/2002 |
|---|---|---|
| JP | 2004-268104 A | 9/2004 |

(Continued)

*Primary Examiner* — Zandra Smith
*Assistant Examiner* — Molly Reida
(74) *Attorney, Agent, or Firm* — Global IP Counselors, LLP

(57) ABSTRACT

A method for manufacturing a semiconductor element includes providing a wafer having a sapphire substrate and a semiconductor stacked body disposed on the sapphire substrate, performing a first scanning of a portion of the sapphire substrate in which a laser beam is irradiated into an interior of the sapphire substrate, performing a second scanning of the portion of the sapphire substrate in which a laser beam is irradiated into the interior of the sapphire substrate, the second scanning occurring after the first scanning and before a void is produced in the interior of the sapphire substrate irradiated with the laser beam in the first scanning, and separating the wafer into a plurality of semiconductor elements.

19 Claims, 9 Drawing Sheets

(51) Int. Cl.
  *H01L 33/42* (2010.01)
  *B23K 26/00* (2014.01)
  *B23K 101/40* (2006.01)

(56) References Cited

U.S. PATENT DOCUMENTS

| | | | |
|---|---|---|---|
| 2001/0035401 A1* | 11/2001 | Manor | B23K 26/0604 |
| | | | 219/121.72 |
| 2003/0006221 A1* | 1/2003 | Hong | B23K 26/0604 |
| | | | 219/121.72 |
| 2004/0002199 A1 | 1/2004 | Fukuyo et al. | |
| 2004/0232124 A1* | 11/2004 | Nagai | B23K 26/0063 |
| | | | 219/121.72 |
| 2005/0173387 A1 | 8/2005 | Fukuyo et al. | |
| 2005/0181581 A1 | 8/2005 | Fukuyo et al. | |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2006/0040473 A1 | 2/2006 | Fukuyo et al. | |
| 2006/0160331 A1 | 7/2006 | Fukuyo et al. | |
| 2007/0298529 A1 | 12/2007 | Maeda et al. | |
| 2010/0055876 A1 | 3/2010 | Fukuyo et al. | |
| 2010/0176100 A1 | 7/2010 | Fukuyo et al. | |
| 2011/0021004 A1 | 1/2011 | Fukuyo et al. | |
| 2011/0027971 A1 | 2/2011 | Fukuyo et al. | |
| 2011/0027972 A1 | 2/2011 | Fukuyo et al. | |
| 2011/0037149 A1 | 2/2011 | Fukuyo et al. | |
| 2012/0190175 A1 | 7/2012 | Fukuyo et al. | |
| 2012/0205357 A1 | 8/2012 | Fukuyo et al. | |
| 2012/0228276 A1 | 9/2012 | Fukuyo et al. | |
| 2012/0279947 A1 | 11/2012 | Fukuyo et al. | |
| 2013/0017670 A1 | 1/2013 | Fukuyo et al. | |
| 2013/0023076 A1 | 1/2013 | Uchiyama | |
| 2013/0040466 A1 | 2/2013 | Abe | |
| 2015/0111365 A1 | 4/2015 | Fukuyo et al. | |
| 2015/0372188 A1* | 12/2015 | Minakuchi | H01L 33/0095 |
| | | | 438/33 |

FOREIGN PATENT DOCUMENTS

| | | |
|---|---|---|
| JP | 2008-098465 A | 4/2008 |
| JP | 2012-004321 A | 1/2012 |
| JP | 2013-042119 A | 2/2013 |
| JP | 2014-036062 A | 2/2014 |
| JP | 2014-241359 A | 12/2014 |
| JP | 2015-157293 A | 9/2015 |
| WO | 2011-158672 A1 | 12/2011 |
| WO | 2012-006736 A2 | 1/2012 |
| WO | 2013-043173 A1 | 3/2013 |

* cited by examiner

METHOD FOR MANUFACTURING SEMICONDUCTOR ELEMENT

CROSS-REFERENCE TO RELATED APPLICATIONS

This application claims priority to Japanese Patent Application No. 2015-196595 filed on Oct. 2, 2015. The entire disclosure of Japanese Patent Application No. 2015-196595 is hereby incorporated herein by reference.

BACKGROUND

1. Technical Field

The present disclosure relates to a method for manufacturing a semiconductor element.

2. Description of Related Art

Semiconductor elements such as light emitting diodes (LEDs) are produced by epitaxially growing a semiconductor layer on a substrate and then separating the resulting wafer into individual elements. Examples of how the wafer is separated into individual elements include the use of a dicer, a scriber, and a laser scriber. A sapphire substrate is typically used as the substrate when a nitride semiconductor is used for the semiconductor layer.

One method that has been proposed for dividing up elements having the sapphire substrate involves using a short-pulse laser (femtoseconds (fsec) or picoseconds (psec)) to emit a laser beam from the rear side of the sapphire substrate to produce a modified region in the interior of the substrate, produce cracks or the like from the modified region, and split along these lines. Sometimes, due to the fact that the sapphire substrate is thick or another such reason, the laser that forms the modified region may not cut sufficiently with a single scanning pass. Methods that have been proposed to avoid this problem are a method in which the laser scanning is performed a number of times at different depths to provide a plurality of rows of modified regions (for examples, see Japanese Unexamined Patent Application Publication Nos. 2008-98465 and 2002-205180), and a method in which a plurality of rows of modified regions are made to overlap each other (for examples, see Japanese Unexamined Patent Application Publication No. 2014-36062).

SUMMARY

However, making a number of laser scans at different depths means that the laser focal position is also set near the semiconductor layer. The closer the laser focal position approaches the semiconductor layer, the more likely it is that the semiconductor layer will be damaged by the laser beam. A semiconductor element whose semiconductor layer has been damaged tends to have more reverse current. Since a semiconductor element whose reverse current exceeds a specific value is deemed a reject, damage to the semiconductor layer is linked to a decrease in the yield. Also, there is a method in which the pulse energy is increased in addition to increasing the number of laser scans in an effort to improve splitting, but here again, the semiconductor layer tends to be damaged by the elevated pulse energy.

Also, when the semiconductor element has a light emitting layer, there may be situations in which tiny voids or cracks that occur in the modified region cause the light that is trying to go from the interior of the semiconductor element to the exterior to be scattered, absorbed, etc., so that less of the light is extracted on the outside. Also, rough surface in the modified region can make it easier for the light to be extracted from the side surfaces of the semiconductor element, resulting in relatively less light being extracted from the top surface of the semiconductor element. The larger is the surface area of the modified region, the greater is this loss of light, and this tends to be linked to a decrease in optical output. The more times laser scanning is performed at different depths in order to improve splitting, the more the surface area of the modified region increases, and this has a tendency to increase the loss of light.

A method for manufacturing a semiconductor element of the present disclosure includes providing a wafer having a sapphire substrate and a semiconductor stacked body disposed on the sapphire substrate, performing a first scanning of a portion of the sapphire substrate in which a laser beam is irradiated into an interior of the sapphire substrate, performing a second scanning of the portion of the sapphire substrate in which a laser beam is irradiated into the interior of the sapphire substrate, the second scanning occurring after the first scanning and before a void is produced in the interior of the sapphire substrate irradiated with the laser beam in the first scanning, and separating the wafer into a plurality of semiconductor elements.

Another method for manufacturing a semiconductor element of the present disclosure includes, providing a wafer having a sapphire substrate and a semiconductor stacked body disposed on the sapphire substrate, performing a first scanning of a portion of the sapphire substrate in which a laser beam is irradiated into an interior of the sapphire substrate, performing a second scanning of the portion of the sapphire substrate in which a laser beam is irradiated into the interior of the sapphire substrate from the second end of the wafer to the first end of the wafer; the second scanning occurring continuously after the first scanning, and separating the wafer into a plurality of semiconductor elements.

Still another method for manufacturing a semiconductor element of the present disclosure includes providing a wafer having a sapphire substrate and a semiconductor stacked body disposed on the sapphire substrate, performing a first scanning of a portion of the sapphire substrate in which a laser beam emitted from a first laser is irradiated into an interior of the sapphire substrate, performing a second scanning of the portion of the sapphire substrate in which a laser beam emitted from a second laser is irradiated into the interior of the sapphire substrate following the first scanning, and separating the wafer into a plurality of semiconductor elements.

With the manufacturing methods discussed above, splitting of the wafer can be improved, and less damage is inflicted on the semiconductor stacked body.

DETAILED DESCRIPTION

An embodiment according to the method for manufacturing a semiconductor element of the present disclosure will be described below with reference to the accompanying drawings. In the following embodiment that embody the technological concept of the present invention are just examples, and unless otherwise specified, the constituent parts discussed in the embodiment are not intended to limit the scope of the present invention. In the descriptions below, components with the same name and label number indicate identical or materially the same components and their detailed description may be appropriately abbreviated. The sizes and the arrangement relationships of the members in each of drawings are occasionally shown exaggerated for ease of explanation.

Figure 1:
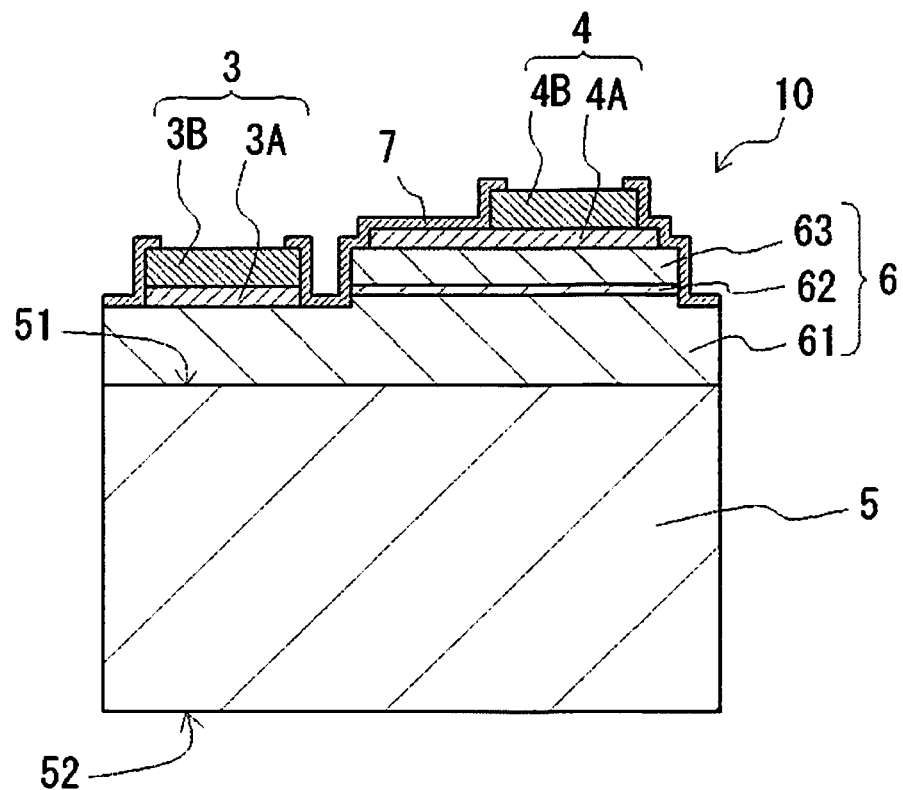
FIG. 1 is a schematic cross sectional view of a semiconductor element according to an embodiment.

First, a semiconductor element 10 obtained by a manufacturing method in this embodiment is shown in FIG. 1. FIG. I is a schematic cross sectional view of the semiconductor element 10 according to this embodiment. The semiconductor element 10 has a sapphire substrate 5 and a semiconductor stacked body 6 disposed on this substrate. The sapphire substrate 5 has a first main surface 51 and a second main surface 52. The surface on the side where the semiconductor stacked body 6 is disposed is the first main surface 51, and the surface on the opposite side from the first main surface 51 is the second main surface 52.

An LED is an example of the semiconductor element 10. The semiconductor element 10 shown in FIG. 1 is the LED, and the semiconductor stacked body 6 has a light emitting layer 62. More specifically, it has an n-side semiconductor layer 61, the light emitting layer 62, and a p-side semiconductor layer 63, in that order, starting from a sapphire substrate 5 side. The n-side semiconductor layer 61 is usually composed of a plurality of n-type semiconductor layers, but some of them may be undoped layers. Similarly, the p-side semiconductor layer 63 is usually composed of a plurality of p-type semiconductor layers, but some of them may be undoped layers. The light emitting layer 62 has, for example, a multiple quantum well structure or a single quantum well structure. The semiconductor stacked body 6 can be formed by epitaxial growth on the sapphire substrate 5. The median wavelength of the light emitted by the light emitting layer 62 is from 360 to 650 nm, for example. A nitride semiconductor is an example of the material of which the semiconductor stacked body 6 is made.

The semiconductor element 10 has an n electrode 3 and a p electrode 4. The n electrode 3 is connected to the n-side semiconductor layer 61, and the p electrode 4 is connected to the p-side semiconductor layer 63. The p electrode 4 has, for example, a light-transmitting conductive layer 4A that is in contact with the p-side semiconductor layer 63, and a pad electrode 4B disposed on this. Similarly, the n electrode 3 may have a light-transmitting conductive layer 3A and a pad electrode 3B. Since the sapphire substrate 5 has insulating properties, the n electrode 3 and the p electrode 4 are disposed on the same side of the semiconductor element 10. After the semiconductor stacked body 6 including the n-side semiconductor layer 61, the light emitting layer 62 and the p-side semiconductor layer 63 is formed on the sapphire substrate 5, part of the light emitting layer 62 and the p-side semiconductor layer 63 is removed, and then the n electrode 3 is formed on the exposed surface of the n-side semiconductor layer 61. Furthermore, an insulated protective film 7 can be disposed which opens onto a specific region of the pad electrode 3B and the pad electrode 4B.

Figure 2:
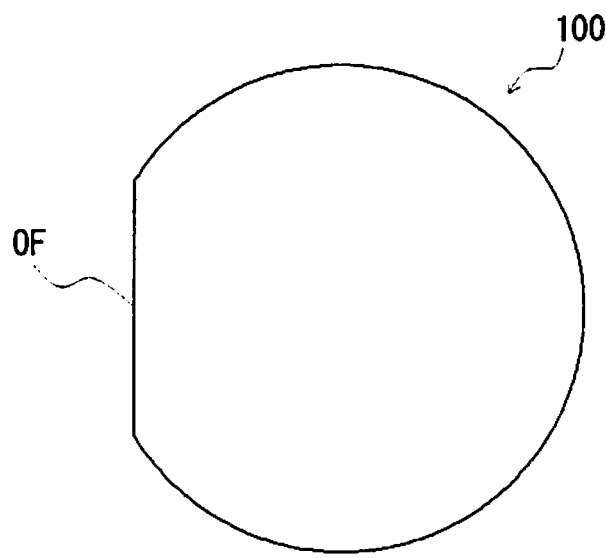
FIG. 2 is a schematic plane view illustrating a method for manufacturing the semiconductor element according to the embodiment.
Figure 3:
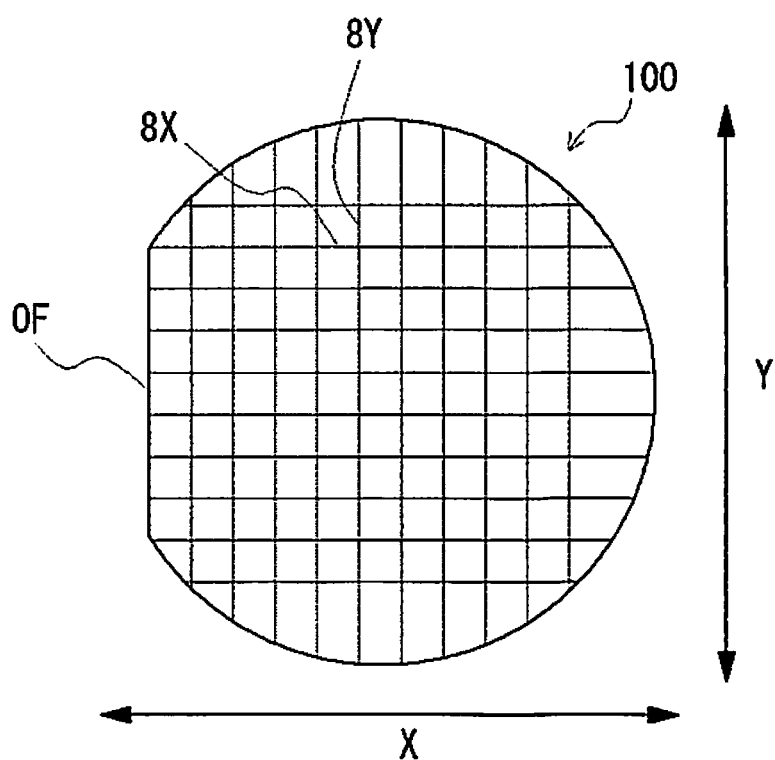
FIG. 3 is a schematic plane view illustrating the method for manufacturing the semiconductor element according to the embodiment.
Figure 4A:
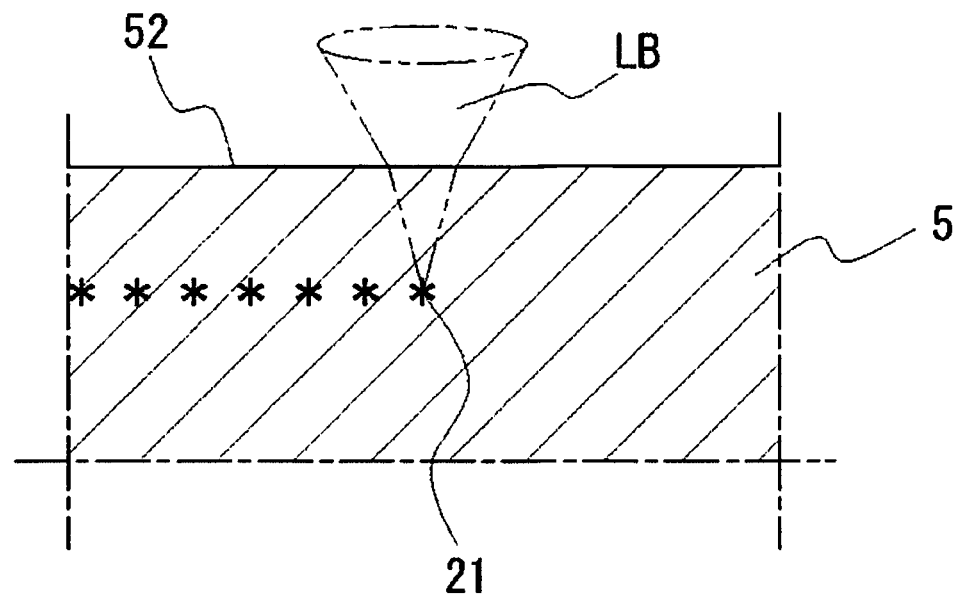
FIG. 4A is a schematic cross sectional views illustrating first scanning of a wafer.
Figure 4B:
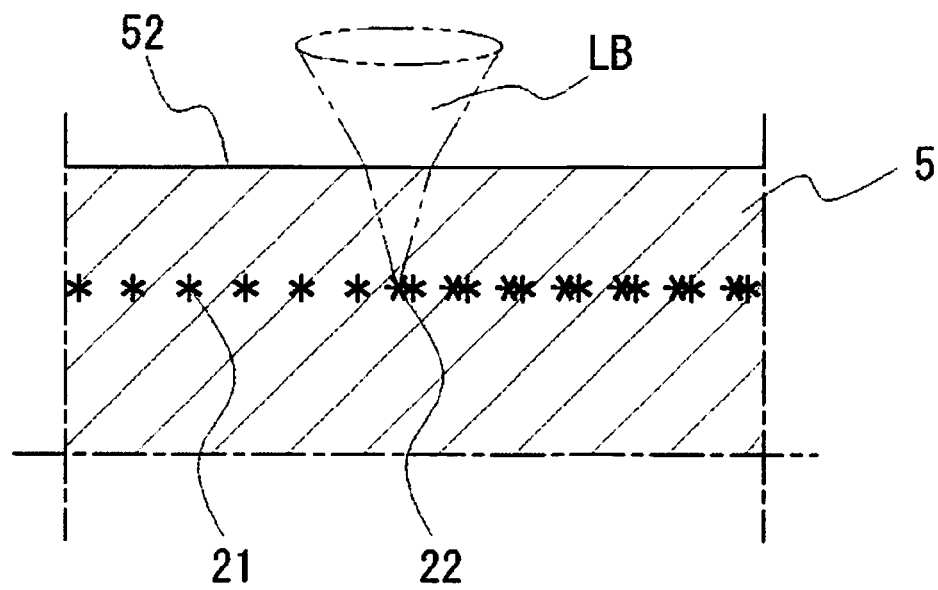
FIG. 4B is a schematic cross sectional views illustrating second scanning of the wafer.

FIGS. 2 and 3, and 4A and 4B are schematic views illustrating the method for manufacturing the semiconductor element according to this embodiment; FIGS. 2 and 3 are plan views of the wafer 100 and FIGS. 4A and 4B are schematic partial enlarged cross sectional views of the wafer 100. FIGS. 4A and 4B show the cross sectional views along with a direction perpendicular to the second main surface 52. As shown in FIGS. 2 to 4B, the method for manufacturing the semiconductor element 10 according to this embodiment includes a step of providing the wafer 100 in which the semiconductor stacked body 6 is disposed on the sapphire substrate 5, a first scanning step of performing first scanning in which a laser beam LB is irradiated into the interior of the sapphire substrate 5, a second scanning step of performing second scanning in which the laser beam LB is irradiated into the interior of the sapphire substrate 5 so as to scan the same portion as in the first scanning, and a separation step of separating the wafer 100 into a plurality of semiconductor elements 10.

Provision Step

First, as shown in FIG. 2, the wafer 100 is disposed. The wafer 100 has the sapphire substrate 5 and the semiconductor stacked body 6 disposed on the sapphire substrate 5. The wafer 100 is cut up to obtain the semiconductor element 10 shown in FIG. 1, but since the wafer 100 in this step has yet to be cut up, it is in a state in which the structures that will become the semiconductor elements 10 are still linked. The thickness of the sapphire substrate 5 is from 200 μm to 2 mm, for example, when the semiconductor stacked body 6 is formed by epitaxial growth. The thickness of the sapphire substrate 5 is from 50 μm to 1 mm, and preferably 50 μm to 300 μm, for example, when the semiconductor stacked body is cut described below. The sapphire substrate 5 may be made thinner by polishing or the like after the epitaxial growth.

First and Second Scanning Steps

Next, the wafer 100 is laser scribed. Laser scribing includes first scanning and second scanning.

First, as shown in FIG. 4A, first scanning is performed in which the laser beam LB is directed toward the sapphire substrate 5 from one main surface side of the sapphire substrate 5 (the second main surface 52 here). In FIG. 4A, the pulsed laser beam LB is scanned from left to right in the drawing. The focal position of the laser beam LB is set in the interior of the sapphire substrate 5. The focal position of the laser beam LB is located in the laser spot 21 shown in FIG. 4A. Scanning with the laser beam LB is performed in a direction substantially parallel to the second main surface 52. Specifically, it is performed so that all of the focal positions of the laser beam LB will be disposed in a straight line parallel to the second main surface 52. The laser beam LB can be a femtosecond laser, a picosecond laser, or another such pulse laser beam, a continuous wave laser beam that can bring about multi-photon absorption, or the like. The wavelength of the laser beam LB is selected from among wavelengths that can pass through the sapphire substrate 5. For instance, a laser with a wavelength of 1030 nm and a pulse width of 5000 fsec can be used.

As shown in FIG. 4B, second scanning is then performed after the first scanning. In the second scanning, the laser beam LB is directed into the interior of the sapphire substrate 5 so as to scan the same portion as in the first scanning. The "same portion" here means that the position is the same in a plan view of the wafer 100, and the depth is also the same. Specifically, the second scanning has its scanning range set the same as in the first scanning in a plan view of the wafer 100, and the depth of the focal position is also set the same as in the first scanning. The focal position of the laser beam LB is located within the laser spot 22 shown in FIG. 4B. In FIG. 4B a pulsed laser beam LB is scanned from right to left in the drawing.

This second scanning is performed before any voids are formed in the portion irradiated with the laser beam LB in the first scanning.

When the interior of the sapphire substrate 5 is irradiated with the laser beam LB, crystals in the irradiated region are distorted by the energy of the laser beam LB, and this produces voids. These voids serve as the starting point for the modified region in which the voids were produced, and a crack develops in the interior of the sapphire substrate 5. The scanning of the laser beam LB is performed so that focal position of the laser beam LB and the modified region 23 produced nearby are connected in a straight line, resulting in a band shape that extends in a direction substantially parallel to the second main surface 52 (see FIG. 5; discussed below). Cracks extending in the substrate thickness direction from this band-shaped modified region 23 are then utilized to separate the wafer 100. This is the separation step using laser scribing. The faster the cracks propagate, the easier it tends to be to cut up the wafer 100.

The purpose of the second scanning is to promote development of the cracks, but in the case where the second scanning is performed at portions where voids have been produced by the first scanning, the majority of the laser beam LB in the second scanning will be scattered by the voids. This makes it hard to sufficiently promote crack development. However, it has been confirmed that when the second scanning overlaps the first scanning by a very short amount of time, crack development can be sufficiently promoted. This is believed to be because the cracks are only produced after a certain amount of time has passed, rather than being produced immediately after the voids have been irradiated with the laser beam LB. Accordingly, it is possible to irradiate the interior of the sapphire substrate 5 with the laser beam LB in the second scanning by performing the second scanning of the laser beam LB before the voids are produced by the first scanning. The synergistic effect of the laser beam LB in the first scanning and the laser beam LB in the second scanning allows the cracks to develop further than with just the first scanning alone. This improves the linearity of the splitting reference line, and also improves the perpendicularity of the splitting plane, that is, allows the angle of the splitting plane to the second main surface to be close to 90 degrees.

In addition, since the second scanning is performed at the same depth as the first scanning, the distance of the focal position in each scan from the semiconductor stacked body 6 is substantially equal. Consequently, the risk of damage to the semiconductor stacked body 6 can be substantially the same as low as with the first scanning alone. Furthermore, another advantage is that the width of machining marks 24 in the thickness direction of the sapphire substrate 5 can be substantially the same as with the first scanning alone. Consequently, in the case where the separated semiconductor elements 10 are LEDs, the decrease in optical output attributable to the machining marks 24 can be suppressed. Avoiding a decrease in optical output attributable to the machining marks 24 is particularly advantageous in mounting modes in which it is difficult for light coming out of the side surfaces of the semiconductor element 10 to be extracted to the outside. Examples of such a mounting mode include when mounting to a side view type of package, and when the side surfaces of the semiconductor element are covered by a light blocking member.

To describe this from another perspective, a similar effect can be obtained in the case where the interior of the sapphire substrate 5 is irradiated with the laser beam LB so that the first scanning step is performed one end of the wafer 100 to the other, after which the second scanning is performed continuously from the other end to the one end over the same portion as in the first scanning.

As shown in FIG. 3, laser scribing for separating into the semiconductor elements 10 is performed a plurality of times in a first direction X and a second direction Y. First a plurality of splitting reference lines 8X are formed by performing first scanning, and only then is the second scanning commenced. In this case, since the elapsed time until the second scanning overlaps the same portion as in the first scanning is extremely long, it is conceivable that a void will have been produced by the first scanning by the time the second scanning overlaps. This makes it hard to promote the development of cracks. In view of this, the first scanning and second scanning are performed continuously. For example, the first scanning is performed to form one splitting reference line 8X, and then the second scan is performed to form the same splitting reference line 8X such that it goes back. With this back and forth scanning, there is no need to perform a blank scan that returns from the end point of the first scan back to the starting point, and the movement distance can be kept to a minimum, so the elapsed time from the first scan until the second scan can be shortened. Consequently, irradiation with the laser beam LB from the second scanning is possible before voids are produced by the laser beam LB in the first scanning. Thus continuously performing the first and second scanning creates a synergistic effect between the laser beam LB of the first scan and the laser beam LB of the second scan, which allows cracks to develop better than when the scanning is performed only once. Furthermore, when the scanning is performed back and forth as here, the end point of the first scan coincides with the starting point of the second scan, so the elapsed time after the first scan is performed until the second scan is performed is shorter the closer it is to the end point of the first scan.

A specific example of the elapsed time from the first scan to the second scan for obtaining the above effect is 10 seconds or less. Specifically, the second scan is preferably performed so that the same portion as in the first scan is scanned within 10 seconds after this portion was scanned the first time. After a single scan in which the laser beam LB is irradiated into the interior of the sapphire substrate 5, the place where the scan was performed was observed, and it was noted that the generation of voids and the start of crack development came at least 10 seconds after irradiation with the laser beam LB. Specifically, it is believed that when the second scan overlaps within 10 seconds the place where the first scan was performed, there will be no change in the shape produced by the first scan at the irradiation location of the laser beam LB in the second scan, and the convergence of the second scan will be hindered. This time setting is preferably performed at all portions where the first and second scans overlap. For instance, the first scanning and the second scanning for forming a single splitting reference line are performed by back and forth scanning within 10 seconds. The phrase "back and forth scanning within 10 seconds" means back and forth scanning in which the second scanning goes back upon completion of the first scanning, and it takes no more than 10 seconds from the start of the first scan until the end of the second scan. With back and forth scanning, there is no movement for forming different splitting reference lines between the first and second scans, so the process can be completed in less time. Furthermore, the speed of the first scanning and the second scanning is preferably a speed that allows reciprocal coverage of the diameter of the wafer 100 within 10 seconds.

Meanwhile, it is believed that in the case where the second scan is performed before the onset of stress produced by the first scan, there will be no synergistic accumulation of stress, and the attendant crack development will also be small. Therefore, to obtain better splitting, a scanning method in which there is some elapsed time between the first and second scans as in the above-mentioned reciprocal scanning is preferable to performing the first and second scan simultaneously at the same place. Consequently, it is possible to overlap with the second scan after the onset of stress produced by the first scan in the interior of the sapphire substrate 5, and crack development can be better promoted. To specifically determine the preferable elapsed time for this, the time from when the sapphire substrate was irradiated with one pulse of the laser beam LB until the same site was irradiated with the next pulse was varied, and the crack development state was observed. As a result, it was found that the crack development in the thickness direction of the sapphire substrate was lower when the time was less than 100 msec than when it was 100 msec or longer. This implies that the onset of stress occurs when at least 100 msec (0.1 second) has elapsed after irradiation with one pulse of the laser beam LB. Therefore, the second scan is preferably performed so that the same portion as in the first scan is scanned after 0.1 second has elapsed after the first scanning of said portion. This time setting is preferably performed for all of the portion where the first and second scans overlap.

Figure 5:
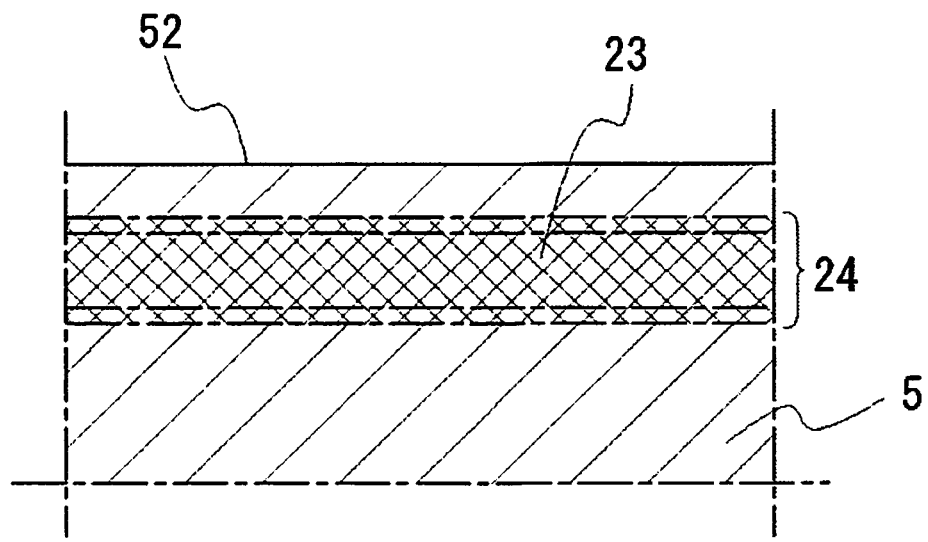
FIG. 5 is a schematic diagram of part of a side surface of the semiconductor element after separation.

As shown in FIG. 4B, the laser spot 21 in the first scan and the laser spot 22 in the second scan do not have to coincide completely, and there may be some offset. This is because promoting crack development does not rely on the matching up of the laser spots 21 and 22, but rather on their overlapping to the extent that the stress produced by the first scanning and the stress produced by the second scanning interfere with each other. As shown in FIG. 5 (discussed below), laser scribing is usually performed so that the modified region 23 is in the shape of a band, and both the first scanning and the second scanning may be performed in a similar way. More specifically, the pulse energy, pulse width, and so forth discussed below may be employed.

The pulse energy of the laser beam LB in the second scanning is preferably the same as the pulse energy of the laser beam LB in the first scanning. In the case that the pulse energy of one is stronger, the semiconductor stacked body 6 will be more susceptible to damage, and conversely, in the case that the pulse energy of one is weaker, splittability will suffer. Therefore, having the pulse energy of the two be substantially the same, rather than having one greater than the other, is preferable in terms of carrying out the processing efficiently. Furthermore, it is preferable for the laser beams in the first and second scans to be from the same laser and optical system, and for their pulse energy and pulse width to be the same in both. Thus having the regions in which modified regions can be formed in the first and second scans overlap substantially completely allows the range over which a finely textured region is produced in the modified region 23 and its surroundings (the range over which the machining mark 24 is produced) to be substantially the same as with just a single scan. Also, the pulse energy of the laser beam LB in the first and second scans is preferably at least 1 μJ and no more than 10 μJ. This allows good splitting to be obtained without having the laser beam LB produce a machining mark 24 that is too large.

When an LED or another such semiconductor light emitting element is used as the semiconductor element 10, a decrease in optical output can be suppressed by suppressing an increase in the width of the machining mark 24 as mentioned above. The width of the machining mark 24 produced by the first scan and the second scan at the side surface of the semiconductor element 10 is preferably no more than 50 μm and more preferably no more than 30 μm, the lower limit of the width of the machining mark 24 can be 10 μm or more and preferably 15 μm or more. The width of the machining mark 24 is the width in the thickness direction of the sapphire substrate 5. The width of the machining mark 24 is determined by the irradiation width of the laser beam LB, that is, by the size of the laser spot. The size of the laser spot can be adjusted with the pulse energy and pulse width of the laser beam LB, the numerical aperture (NA) and the focal depth of the lens that converges the laser beam LB, and so forth.

Also, the convergence position of the laser beam LB in the first and second scans is preferably set to be shallower than one half the thickness of the wafer 100. This allows cracks to develop readily in the surface of the semiconductor element 10, and affords easier splitting.

In the first and second scans, the laser beam LB is preferably irradiated from a second main surface 52 side of the wafer 100. The second main surface 52 side is the opposite side of the wafer 100 from the side on which the semiconductor stacked body 6 is disposed. In the case that the semiconductor stacked body 6 is thus not present on the path from the emission site of the laser beam LB to the convergence position, this will suppress damage to the semiconductor stacked body 6 by the laser beam LB. In addition, the focal position of the laser beam LB is preferably provided closer to the second main surface 52 than the first main surface 51 of the sapphire substrate 5. Specifically, the distance from the focal position to the first main surface 51 of the sapphire substrate 5 is preferably greater than the distance to the second main surface 52. Thus moving the focal position of the laser beam LB away from the semiconductor stacked body 6 better suppresses damage to the semiconductor stacked body 6 by the laser beam LB. More preferably, the depth of the focal position of the laser beam LB is set so that the machining mark 24 will fall within a range of about 1/5 to 2/5 the thickness of the sapphire substrate 5 from the second main surface 52.

The quasi-peak output of the laser beam LB in the first and second scans is preferably such that the sapphire substrate 5 is not subjected to excessive damage, and the stress required for crack development occurs. Therefore, the pulse width of the laser beam LB in the first scan and the second scan is preferably at least 100 fsec and no more than 10 psec. A laser whose wavelength can pass through the sapphire substrate 5 can be an Nd:YAG laser, Nd:YVO$_4$ laser, Nd:YLF laser, titanium-sapphire laser, and KGW laser.

To simplify the first and second scans, a single laser light source may be operated reciprocally, without changing the various settings. On the other hand, to further improve splitting, the conditions of the laser beam can be intentionally varied between the first scan and the second scan. A specific example is shown in FIGS. 6A to 8B. In FIGS. 6A to 8B, the laser spot 21 of the first scan and the laser spot 22 of the second scan are indicated by different symbols in order to make them easier to tell apart, but this does not necessarily mean that the pulse width and other such conditions are different for the laser spot 21 and the laser spot 22.

Figure 6A:
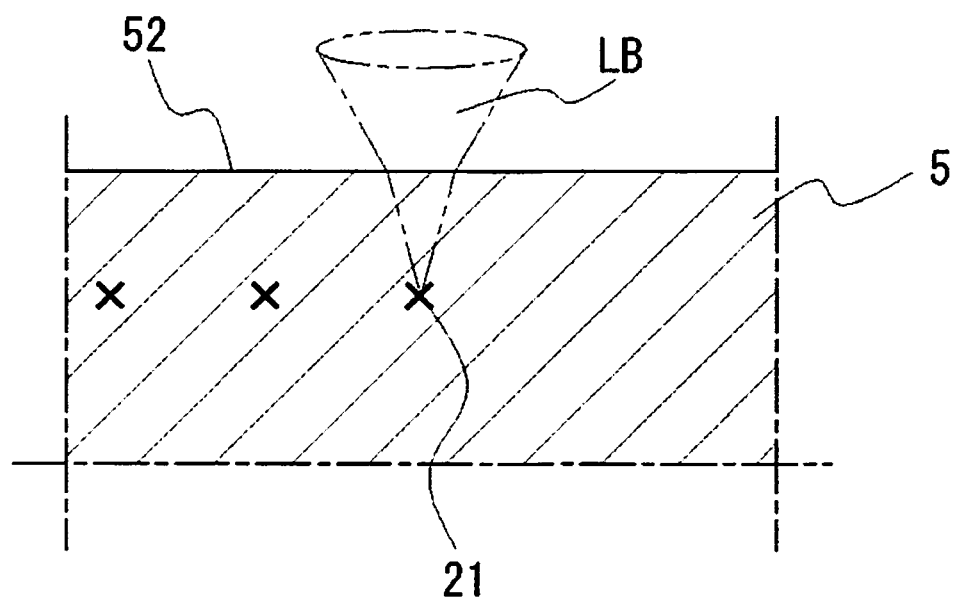
FIG. 6A is schematic cross sectional view illustrating first scanning of the wafer according to a modification example.
Figure 6B:
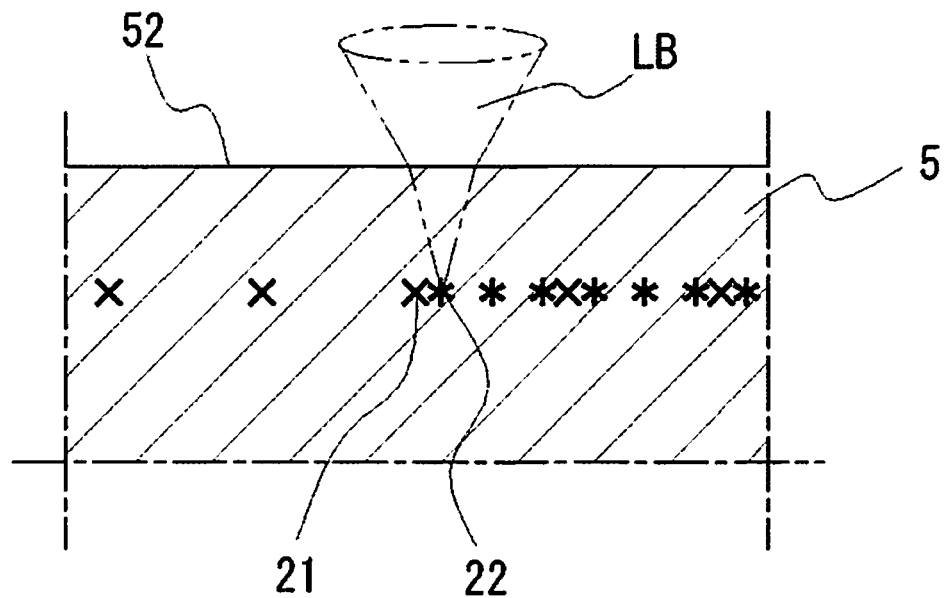
FIG. 6B is schematic cross sectional view illustrating second scanning of the wafer according to the modification example.

FIGS. 6A and 6B show an example in which the pulse pitch of the laser beam in the first scan is greater than the pulse pitch of the laser beam in the second scan. The laser spot 21 of the first scan is shown in FIG. 6A, and a state in which the laser spot 22 of the second scan is superposed over this is shown in FIG. 6B. As shown in FIGS. 6A and 6B, in the case where the pulse pitch is different in the first scan and the second scan, the laser spot 22 will always be disposed between adjacent laser spots 21. Consequently, the stress generated by the laser spot 21 can be better linked and propagated in a direction that is substantially parallel to the second main surface 52 of the sapphire substrate 5. As a result, development of cracks generated by stress in a direction that is substantially parallel to the second main surface 52 is better, and the cracks will develop in a straighter line. The pulse pitch is obtained by dividing the laser scanning rate by the pulse frequency of the laser beam. In order to make the pulse pitch of the laser beam in the first scan be greater than the pulse pitch of the laser beam in the second scan, the frequency of the laser beam in the first scan may be greater than that in the second scan.

Figure 7A:
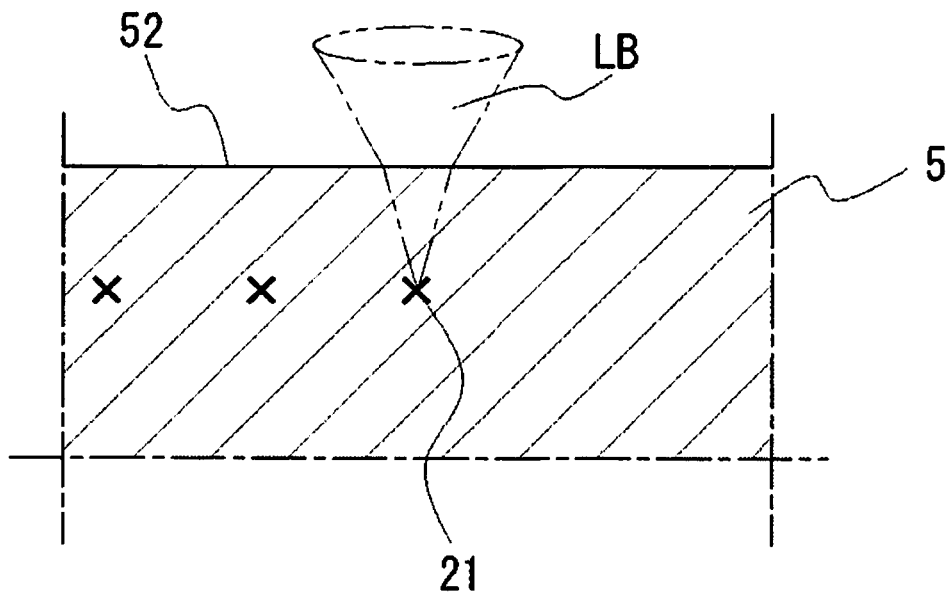
FIG. 7A is schematic cross sectional view illustrating first scanning of the wafer according to a modification example.
Figure 7B:
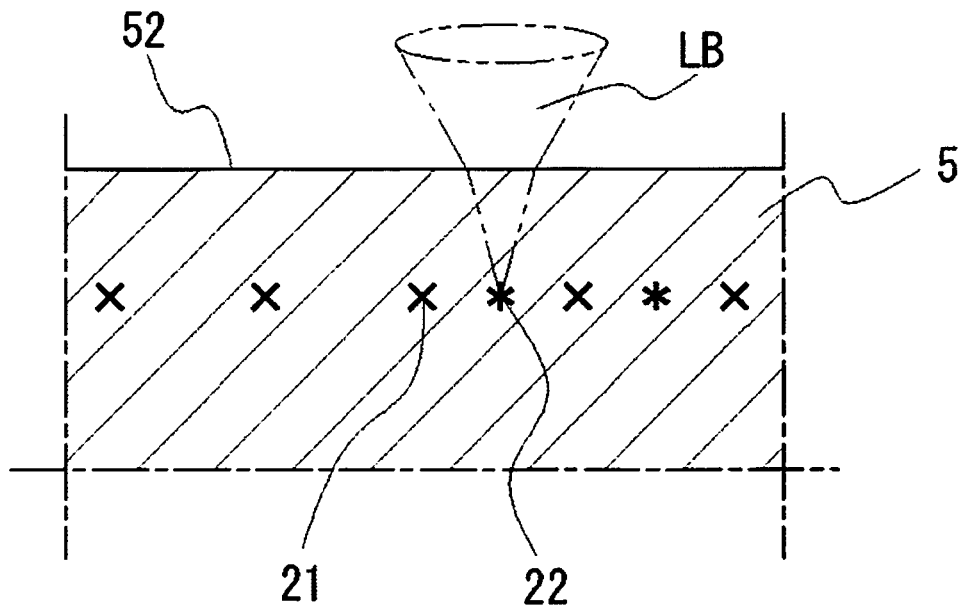
FIG. 7B is schematic cross sectional view illustrating second scanning of the wafer according to the modification example.

FIGS. 7A and 7B show an example in which the laser spot 22 of the second scan is shifted by one-third to two-thirds of a pulse pitch from the laser spot 21 of the first scan. Consequently, the laser spot 21 and the laser spot 22 are disposed so that they repeat alternately. More preferably, the spot is shifted by one-half of a pulse pitch so that the distance will be equal between the laser spot 21 and the laser spot 22. Thus eliminating any overlap in the laser spots in the first and second scans promotes development of the cracks in a direction that is substantially parallel to the second main surface 52, as in the above example. The positions of the laser spots 21 and 22 may be set, for example, by using an encoder to read the scanning position of the actuator that is used to scan the laser beam, and control the system so that the various locations are irradiated with the laser beam.

Figure 8A:
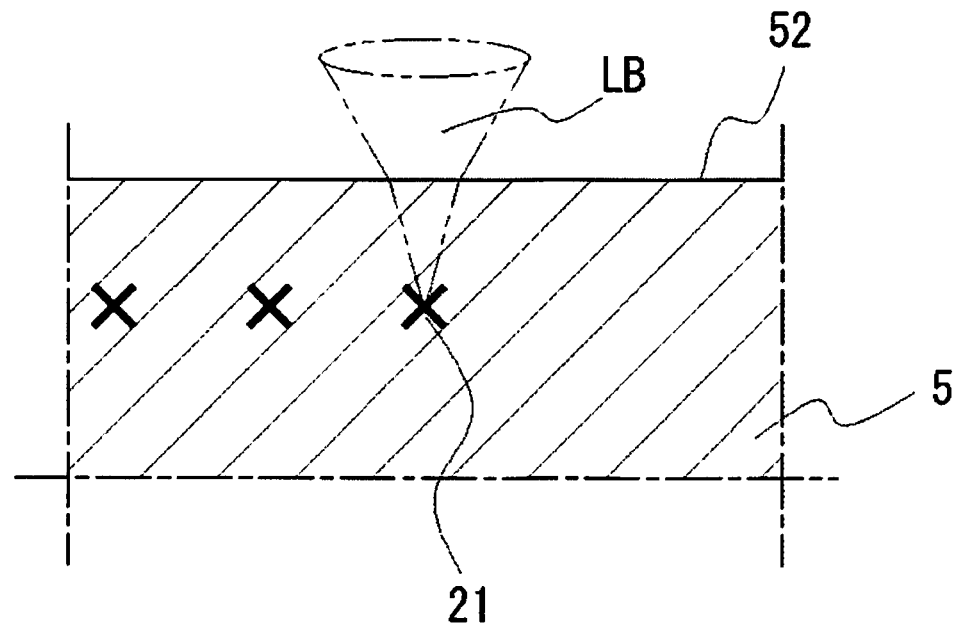
FIG. 8A is schematic cross sectional view illustrating first scanning of the wafer according to a modification example.
Figure 8B:
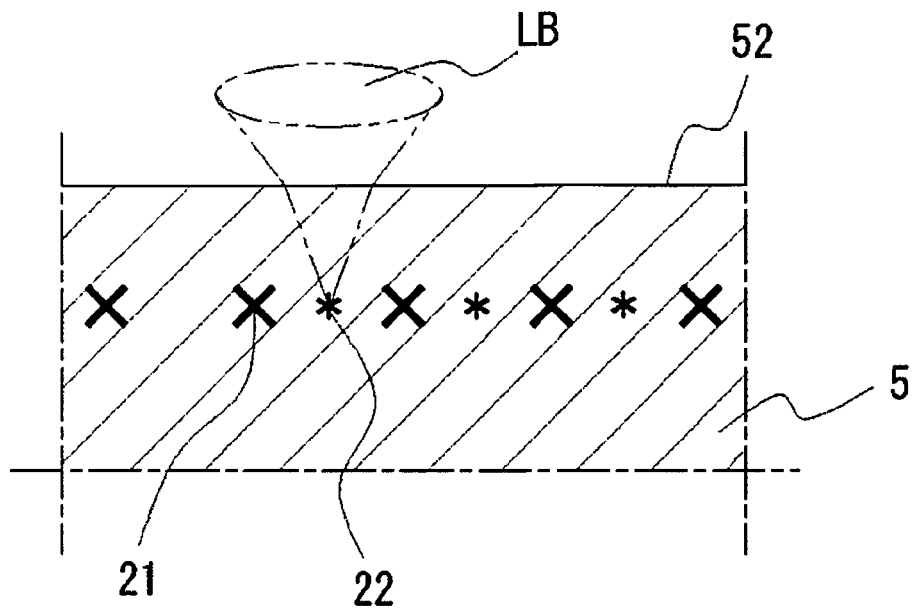
FIG. 8B is schematic cross sectional view illustrating second scanning of the wafer according to the modification example.

FIG. 8A and 8B show an example in which the laser or the converging optical system is changed in the first scan and the second scan. Here, the diameter of the laser spot 22 of the second scan is made smaller than the diameter of the laser spot 21 of the first scan. This creates a division of roles in which the first scan induces stress in the interior of the sapphire substrate 5, while the second scan links and amplifies the stress induced in the first scan. The diameters of the laser spots 21 and 22 are preferably set so as to increase the linearity of crack development. Examples of ways to reducing the laser spot diameter include making the wavelength of the laser beam shorter, and raising the NA of the converging lens.

Figure 9:
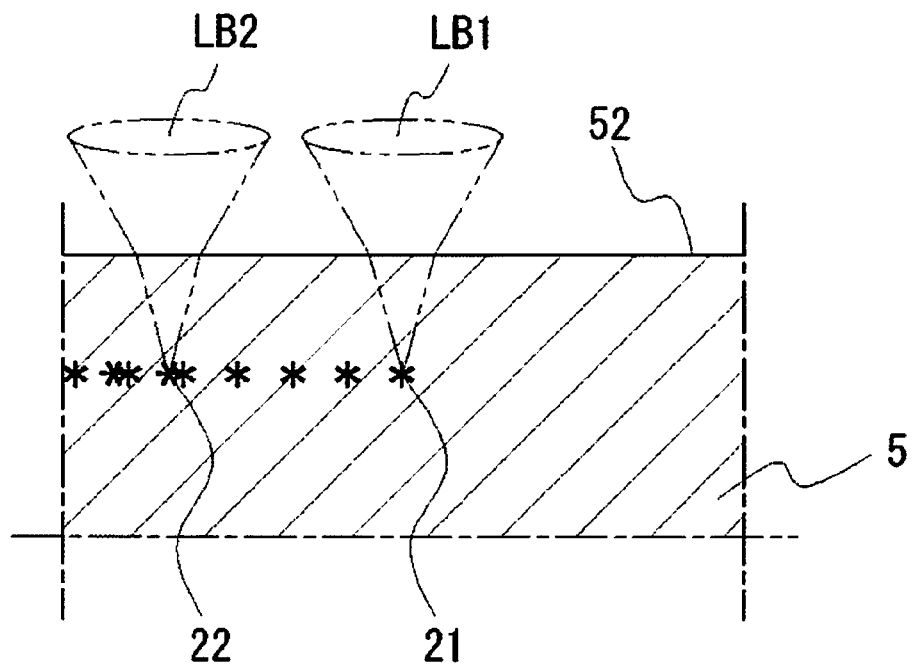
FIG. 9 is a schematic cross sectional view illustrating a scanning of the wafer according to a modification example.

As shown in FIG. 9, two lasers may be used. In this case, the laser scribing will include a first scan in which a laser beam LB1 emitted from a first laser is irradiated into the interior of the sapphire substrate 5, and a second scan in which a laser beam LB2 emitted from a second laser is irradiated into the interior of the sapphire substrate 5 after the first scan so as to scan the same portion as in the first scan. When two lasers are thus used, the second scan can be performed with the second laser without waiting for the first laser to finish scanning one partition line. Consequently, the laser scribing will take less time than when a single laser is used. The preferable ranges for the elapsed time from the first scan to the second scan and other such conditions are as given above. The focal position of the laser beams LB1 and LB2 and so forth can also be the same as those for the laser beam LB.

The more times the laser beam is scanned, the longer the processing takes, so it is preferable to perform only a first scanning step and a second scanning step as the steps for forming the splitting reference line. Specifically, it is preferably only the machining mark 24 produced by the first scanning and the second scanning is located on one side of the semiconductor element 10. In the case that cracks do not develop sufficiently with just one set of first and second scanning due to the fact that the wafer 100 is too thick, etc., another scan may be performed at a different depth from that in the first and second scans. For example, a plurality of sets of scans that are similar to the first and second scans may be performed by changing the scanning depth, or another scan corresponding to just the first scan (no overlapping second scan) may be performed at a different depth from that in the first and second scans. In either of these cases, however, it is preferable in the case where the scanning that is performed closest to the semiconductor stacked body 6 is the first scan and the second scan, that is, that there is no other machining mark left between the semiconductor stacked body 6 and the machining mark 24 produced by the first and second scans. This allows splitting to be improved while suppressing the occurrence of damage to the semiconductor stacked body 6. Also, the more times scanning is performed on a given portion, the longer will be the elapsed time from the first scan to the final scan, making it more likely that voids will be produced by the time the final scan is performed. To avoid this, the scanning performed on a given portion is preferably only the first scan and the second scan.

As shown in FIG. 3, the first and second scans are performed in order to form a plurality of splitting reference lines 8X extending in a first direction X, and a plurality of splitting reference lines 8Y extending in a second direction Y that is different from the first direction. As discussed above, it is preferable to repeat a first scanning step and a second scanning step for each of the splitting reference lines 8X and 8Y. Specifically, it is preferable when a first scan and a second scan for forming a single splitting reference line 8X are performed, after which a first scan and a second scan are performed for forming another splitting reference line 8X. For example, the first direction X is a direction substantially perpendicular to the orientation flat OF, and the second direction Y is a direction substantially parallel to the same. As to the order in which the first scan and the second scan are performed, the first direction X may be first, or the second direction Y may be first.

Separation Step

After the first scan and second scan have been performed as discussed above, the wafer 100 is separated into a plurality of semiconductor elements 10. More specifically, the wafer 100 is split along the splitting reference lines 8X and 8Y and thereby separated into the individual semiconductor elements 10. Since it is difficult to completely split up the wafer 100 with its sapphire substrate 5 by laser scribing alone, it is usually split completely by applying a pressing member to break the wafer. The semiconductor elements 10 that are separated along the splitting reference lines 8X and 8Y shown in FIG. 3 are square in their plan view shape, but the plan view shape of the semiconductor elements 10 is not limited to being square, and may be hexagonal, for example.

FIG. 5 is a schematic diagram of part of the side surface of a semiconductor element 10 after separation. As shown in FIG. 5, the modified region 23 is formed in a band shape extending substantially parallel to the second main surface 52 of the sapphire substrate 5. A fine rough surface is formed around the periphery of the modified region 23, and it is believed that the machining mark 24, which includes the modified region 23 and the rough surface region, is the cause of a decrease in optical output. With the method in this embodiment, even when the first and second scans are performed, the width of the band-shaped machining mark 24 can be substantially the same as that after the first scan alone. This means that the decrease in optical output attributable to the machining mark 24 can be suppressed when the semiconductor elements 10 are LEDs.

With the method for manufacturing the semiconductor elements 10 in this embodiment, the second scan overlaps the first scan, which improves splitting of the wafer 100 and suppresses damage to the semiconductor stacked body. Furthermore, in the case that the semiconductor elements 10 are LEDs or another such semiconductor light emitting element, a decrease in optical output can be suppressed by suppressing an increase in the width of the machining mark 24 produced by laser irradiation.

Example 1

An LED was formed as the semiconductor element according to Example 1. First, a wafer was prepared in which a semiconductor stacked body composed of GaN, AlGaN, InGaN, or another such nitride semiconductor was stacked on the top surface of a sapphire substrate. The thickness of the sapphire substrate was 200 μm.

Next, laser scribing was performed. More specifically, irradiation with a laser beam was performed from the lower surface side of the sapphire substrate, that is, from the opposite side from the side where the semiconductor stacked body was disposed. The laser beam used here had a pulse energy of 3.8 μJ, a pulse width of 5 psec, and a wavelength of 1030 nm. This laser beam was converged in the interior of the sapphire substrate by using a lens with a NA of 0.75. The scanning rate was 300 mm/sec. Reciprocating scanning was performed, in which a first scan was performed, after which a second scan was performed by going back over the same place. In the laser scribing, first, reciprocal scanning of all of intended splitting lines in a direction substantially parallel to the orientation flat of the wafer was performed, and then reciprocal scanning of all of intended splitting lines in a direction substantially perpendicular to the orientation flat was performed. Irradiation of the intended splitting lines with the laser beam is performed on only one reciprocal pass in the first and second scans. The elapsed time from the start of the first scan along each intended splitting line until the end of the second scan was one second at most. The focal position of the laser beam was set so that its distance from the second main surface of the sapphire substrate would be 53 μm. The wafer that had undergone laser scribing under the above conditions was then broken apart into individual LEDs.

Figure 10:
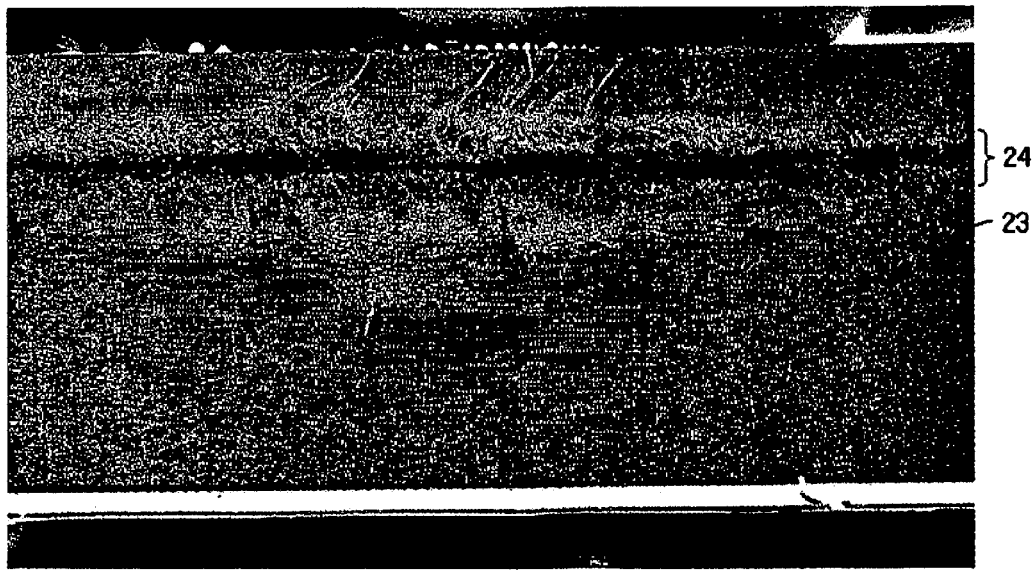
FIG. 10 is a scanning electron micrograph taken from a side of an LED in Example 1.

FIG. 10 is a scanning electron micrograph (SEM) of the resulting LED taken from the side. FIG. 10 is a SEM taken at a magnification of approximately 300 times, and the thickness of the sapphire substrate is approximately 200 μm. In Example 1, laser irradiation was performed two times (a first scan and a second scan), but as shown in FIG. 10, it can be seen that the machining mark 24 is unified into a single band. Also, a black modified region 23 is seen near the center of this band. The reason it appears black is that there is little secondary electron emission during electron microscope observation; that is, it can be seen that the black region is a deep recess. The black region occurs near the focal position of the first and second scans, and it is believed that a deep recess having a short-cycle fine uneven surface is produced by performing the laser irradiation twice. Also, in Example 1, no incomplete splitting was noted anywhere in the wafer, so a splitting completion rate (number of individual elements with a clean break divided by the total number of elements in the wafer) was 100%.

Comparative Example 1

As Comparative Example 1, an LED was formed by the same procedure as in Example 1, except that only the first scan was performed, and the second scan was not performed. In Comparative Example 1, some incomplete splitting, that is, a state in which adjacent LEDs were not completely separated after breaking and were still linked together, was noted. The splitting completion rate in Comparative Example 1 was 95%. In contrast, the splitting completion rate in Example 1 was 100% as mentioned above, so it was confirmed that using the manufacturing method in Example 1 improves splitting over that in Comparative Example 1 in which the second scanning was not performed.

Comparative Example 2

As Comparative Example 2, an LED was formed by the same procedure as in Comparative Example 1, except that the laser conditions were adjusted. In Comparative Example 2, laser scribing was performed under conditions assumed to produce similar splittability as in Example 1 with just a first scan. Specifically, the pulse energy was set to 4.5 μJ, which is higher than in Example 1. Also, the distance of the focal position from the second main surface was changed to 70 μm. When the pulse energy is increased, there tends to be more breakage on the side of the sapphire substrate where the laser beam is incident, that is, the second main surface side, so the focal position was changed with the aim of preventing this breakage.

Figure 11:
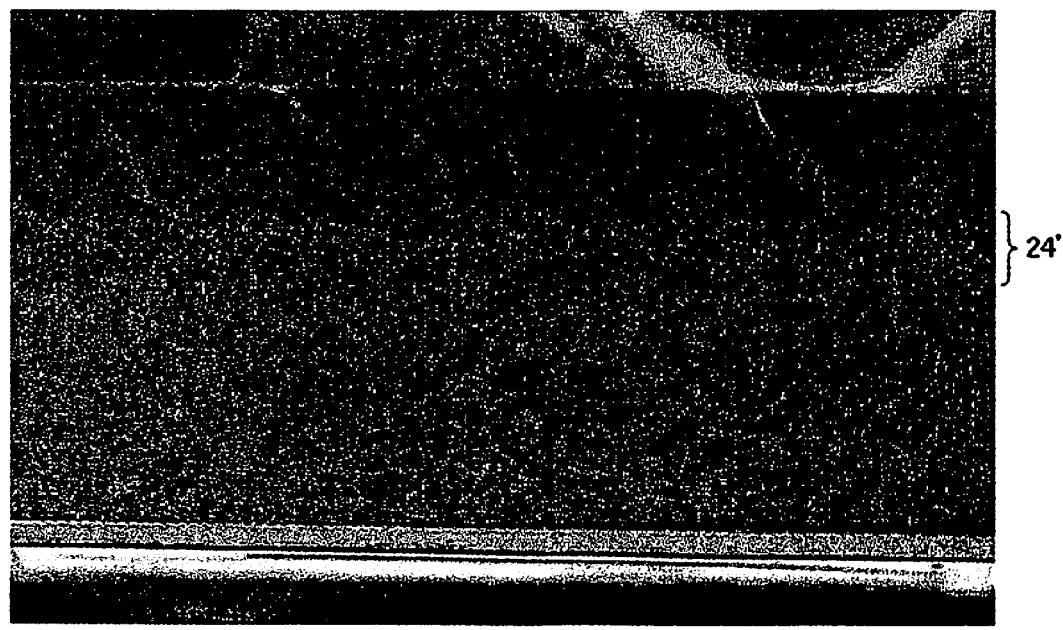
FIG. 11 is a scanning electron micrograph taken from a side of an LED in Comparative Example 2.

FIG. 11 shows a SEM of the LED in Comparative Example 2 taken from the side. As in FIG. 10, FIG. 11 is a SEM taken at a magnification of approximately 300 times, and the thickness of the sapphire substrate is approximately 200 μm. The width of the machining mark 24 was approximately 30 μm in Example 1 (FIG. 10), but the width of the machining mark 24' is approximately 35 μm in Comparative Example 2 (FIG. 11). Rather than trying to obtain a similar degree of splittability with a single scan as in Comparative Example 2, it was confirmed that the width of the machining mark can be decreased by performing the first scan and the second scan as in Example 1. Also, since the pulse energy is higher in Comparative Example 2 than in Example 1, there is the risk of a higher probability of damage to the semiconductor stacked body.

Comparative Example 3

As Comparative Example 3, an LED was formed by the same procedure as in Example 1, except that the focal position was changed in the first scanning and the second scanning. Specifically, the distance of the focal position from the second main surface was 75 μm in the first scan and 50 μm in the second scan so that there would be no overlap between the modified region produced by the first scan and the modified region produced by the second scan. The splitting completion rate was 97% in Comparative Example 3. The splitting completion rate in Example 1 was 100% as mentioned above, so it was confirmed that using the manufacturing method in Example 1 improves splitting more than forming two modified regions as in Comparative Example 3.

Comparative Example 4

As Comparative Example 4, an LED was formed by the same procedure as in Comparative Example 3, except that the focal positions in the first and second scans were changed. The distance of the focal position from the second main surface was 60 μm in the first scan, and 50 μm in the second scan. Since the width of the modified regions was approximately 20 μm, in Comparative Example 4, unlike in Comparative Example 3, the modified regions overlapped by about 10 μm, that is, by about half. The splitting completion rate was 98% in Comparative Example 4. The splitting completion rate in Example 1 was 100% as mentioned above, so it was confirmed that using the manufacturing method in Example 1 improves splitting more than overlapping just part of the modified regions as in Comparative Example 4.

Figure 12:
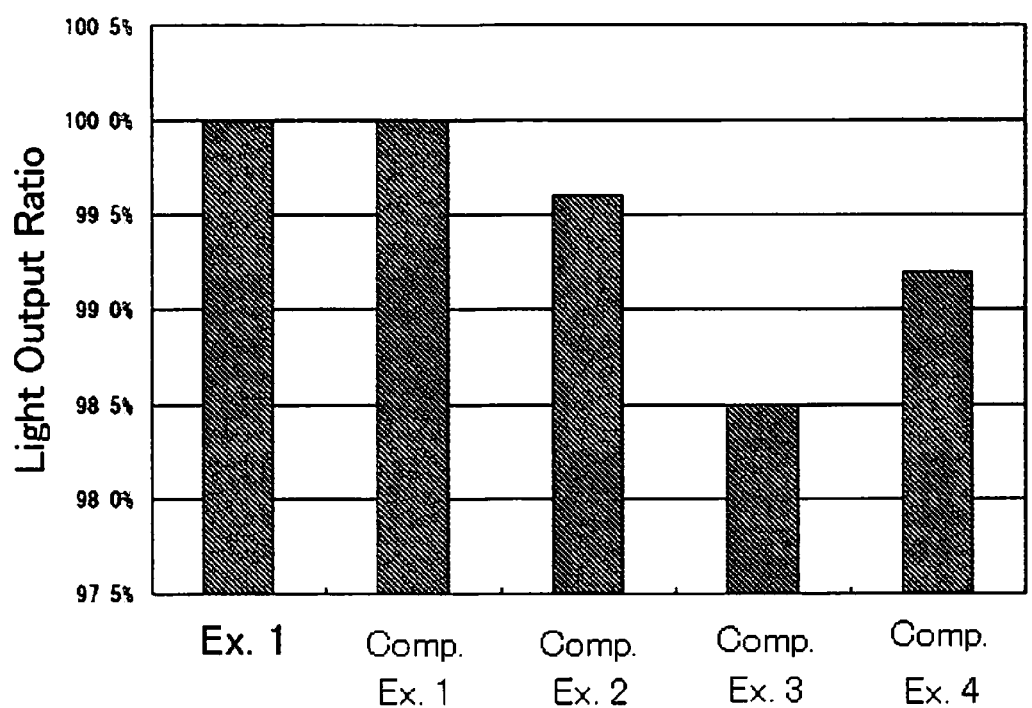
FIG. 12 is a graph that compares the optical output of the LED in Example 1 with that of LEDs in Comparative Examples 1 to 4.

FIG. 12 is a graph that compares the optical output of the LED in Example 1 with that of the LEDs in Comparative Examples 1 to 4. In this graph in FIG. 12, the optical output at a current of 50 mA is shown as a relative value, using the optical output in Example 1 as 100%. In Comparative Example 1, that is, when only the first scan in Example 1 was performed, the optical output was similar to that of Example 1, but the splitting completion rate decreased compared to that of Example 1 as mentioned above. In Comparative Examples 2 to 4, the splitting completion rate was better than in Comparative Example 1, but the optical output was lower than in Example 1, as shown in FIG. 12.

As discussed above, with the manufacturing method in Example 1, an increase in splitting completion and a suppression of the decrease in optical output can both be achieved, which was not realized with the manufacturing methods in Comparative Examples 1 to 4.

What we claims:

1. A method for manufacturing a semiconductor element comprising:
    providing a wafer having a sapphire substrate and a semiconductor stacked body disposed on the sapphire substrate;
    performing a first scanning of a portion of the sapphire substrate in which a laser beam is irradiated into an interior of the sapphire substrate;
    performing a second scanning of the portion of the sapphire substrate in which a laser beam is irradiated into the interior of the sapphire substrate, the second scanning occurring after the first scanning and before a void is produced in the interior of the sapphire substrate irradiated with the laser beam in the first scanning; and
    separating the wafer into a plurality of semiconductor elements.

2. The method for manufacturing a semiconductor element according to claim 1, wherein
    a second pulse energy of the laser beam in the second scanning is the same as a first pulse energy of the laser beam in the first scanning.

3. The method for manufacturing a semiconductor element according to claim 1, wherein
    the second scanning is performed within 10 seconds after completion of the first scanning.

4. The method for manufacturing a semiconductor element according to claim 1, wherein
    the second scanning is performed so that the same portion as in the first scanning is scanned after 0.1 second has elapsed after this portion was scanned in the first scanning.

5. The method for manufacturing a semiconductor element according to claim 1, wherein
    a first speed of the first scanning and a second speed of the second scanning are speeds that allow reciprocal coverage of a diameter of the wafer within 10 seconds.

6. The method for manufacturing a semiconductor element according to claim 1, wherein
    pulse energy of the laser beam is at least 1 μJ and no more than 100 in the first scanning and the second scanning.

7. The method for manufacturing a semiconductor element according to claim 1, wherein
    a surface on a side where the semiconductor stacked body is disposed is a first main surface, and a surface on an opposite side from the first main surface is a second main surface, and the first scanning and the second scanning are performed when the laser beam is directed toward the sapphire substrate from a side of the second main surface.

8. The method for manufacturing a semiconductor element according to claim 7, wherein
    a focal position of the laser beam is disposed closer to the second main surface than the first main surface of the sapphire substrate in the first scanning and the second scanning.

9. The method for manufacturing a semiconductor element according to claim 1, wherein
    pulse width of the laser beam is at least 100 fsec and no more than 10 psec in the first scanning and the second scanning.

10. The method for manufacturing a semiconductor element according to claim 1, wherein
    the first scanning and the second scanning form a first plurality of splitting reference lines extending in a first direction, and a second plurality of splitting reference lines extending in a second direction, the second direction being different from the first direction, and the wafer is split along the first plurality of splitting reference lines and the second plurality of splitting reference lines thereby separated into a plurality of semiconductor elements in the separation step.

11. The method for manufacturing a semiconductor element according to claim 10, wherein only the first scanning and the second scanning are performed for forming the first plurality of splitting reference lines and the second plurality of splitting reference lines.

12. A method for manufacturing a semiconductor element comprising:

providing a wafer having a sapphire substrate and a semiconductor stacked body disposed on the sapphire substrate;

performing a first scanning of a portion of the sapphire substrate in which a laser beam is irradiated into an interior of the sapphire substrate from a first end of the wafer to a second end of the wafer;

performing a second scanning of the portion of the sapphire substrate in which a laser beam is irradiated into the interior of the sapphire substrate from the second end of the wafer to the first end of the wafer; the second scanning occurring continuously after the first scanning; and separating the wafer into a plurality of semiconductor elements.

13. The method for manufacturing a semiconductor element according to claim 12, wherein a second pulse energy of the laser beam in the second scanning is the same as a first pulse energy of the laser beam in the first scanning.

14. The method for manufacturing a semiconductor element according to claim 12, wherein the second scanning is performed within 10 seconds after completion of the first scanning.

15. The method for manufacturing a semiconductor element according to claim 12, wherein the second scanning is performed so that the same portion as in the first scanning is scanned after 0.1 second has elapsed after this portion was scanned in the first scanning.

16. The method for manufacturing a semiconductor element according to claim 12, wherein a first speed of the first scanning and a second speed of the second scanning are speeds that allow reciprocal coverage of a diameter of the wafer within 10 seconds.

17. The method for manufacturing a semiconductor element according to claim 12, wherein a pulse energy of the laser beam is at least 1 µJ and no more than 10 µJ in the first scanning and the second scanning.

18. The method for manufacturing a semiconductor element according to claim 12, wherein pulse width of the laser beam is at least 100 fsec and no more than 10 psec in the first scanning and the second scanning.

19. A method for manufacturing a semiconductor element comprising:

providing a wafer having a sapphire substrate and a semiconductor stacked body disposed on the sapphire substrate;

performing a first scanning of a portion of the sapphire substrate in which a laser beam emitted from a first laser is irradiated into an interior of the sapphire substrate;

performing a second scanning of the portion of the sapphire substrate in which a laser beam emitted from a second laser is irradiated into the interior of the sapphire substrate following the first scanning; and separating the wafer into a plurality of semiconductor elements.

* * * * *